US007365974B2

(12) United States Patent
Hartung

(10) Patent No.: US 7,365,974 B2
(45) Date of Patent: Apr. 29, 2008

(54) METHOD FOR ELECTRONICS EQUIPMENT COOLING HAVING IMPROVED EMI CONTROL AND REDUCED WEIGHT

(75) Inventor: David Hartung, Belmont, MI (US)

(73) Assignee: Smiths Aerospace LLC, Grand Rapids, MI (US)

( * ) Notice: Subject to any disclaimer, the term of this patent is extended or adjusted under 35 U.S.C. 154(b) by 215 days.

(21) Appl. No.: 11/249,258

(22) Filed: Oct. 14, 2005

(65) Prior Publication Data

US 2007/0086158 A1  Apr. 19, 2007

(51) Int. Cl.
*H05K 7/20* (2006.01)
(52) U.S. Cl. ............... 361/695; 361/690; 361/721; 454/184; 165/104.33
(58) Field of Classification Search ............... None
See application file for complete search history.

(56) References Cited

U.S. PATENT DOCUMENTS

| | | | | |
|---|---|---|---|---|
| 3,387,648 A * | 6/1968 | Ward, Jr. et al. | ............ | 165/47 |
| 3,648,113 A * | 3/1972 | Rathjen et al. | ............ | 361/707 |
| 4,089,040 A * | 5/1978 | Paulsen | ............ | 361/691 |
| 4,186,422 A * | 1/1980 | Laermer | ............ | 361/689 |
| 4,674,704 A * | 6/1987 | Altoz et al. | ............ | 244/1 R |
| 5,168,171 A * | 12/1992 | Tracewell | ............ | 307/64 |
| 5,398,159 A * | 3/1995 | Andersson et al. | ............ | 361/695 |
| 5,544,012 A * | 8/1996 | Koike | ............ | 361/695 |
| 5,940,266 A * | 8/1999 | Hamilton et al. | ............ | 361/695 |
| 6,459,579 B1 * | 10/2002 | Farmer et al. | ............ | 361/695 |
| 6,535,382 B2 * | 3/2003 | Bishop et al. | ............ | 361/690 |
| 6,563,704 B2 * | 5/2003 | Grouell et al. | ............ | 361/687 |
| 6,563,706 B1 * | 5/2003 | Strickler | ............ | 361/695 |
| 6,741,466 B1 | 5/2004 | Lebo | | |
| 6,791,836 B2 * | 9/2004 | Cipolla et al. | ............ | 361/687 |
| 6,967,841 B1 * | 11/2005 | Chu et al. | ............ | 361/700 |
| 2003/0198018 A1 * | 10/2003 | Cipolla et al. | ............ | 361/687 |

* cited by examiner

*Primary Examiner*—Boris Chèrvinsky
(74) *Attorney, Agent, or Firm*—John Colligan; William Scott Andes

(57) ABSTRACT

An air cooling apparatus for an aircraft includes a cabinet that is configured to house a plurality of modules in a plurality of module accepting regions, respectively, wherein the cabinet has a backplane region. The apparatus further includes a plurality of air flow passages provided between adjacent ones of the respective module accepting regions of the cabinet. The apparatus also includes a primary air flow unit for providing primary air flow from the backplane region and through the plurality of air flow passages, to thereby cool the plurality of modules housed within the cabinet.

8 Claims, 7 Drawing Sheets

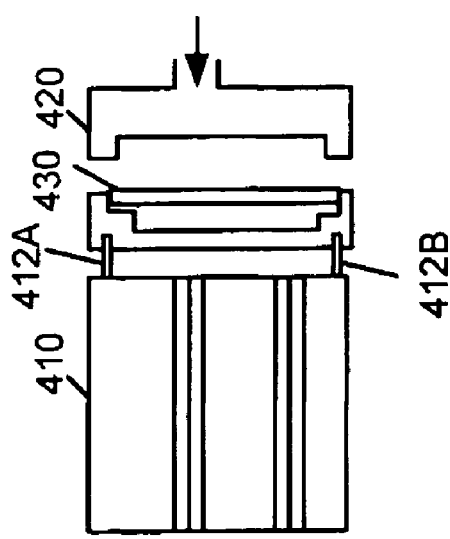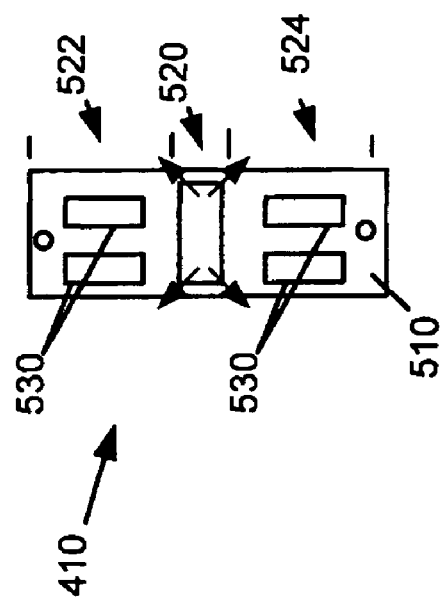

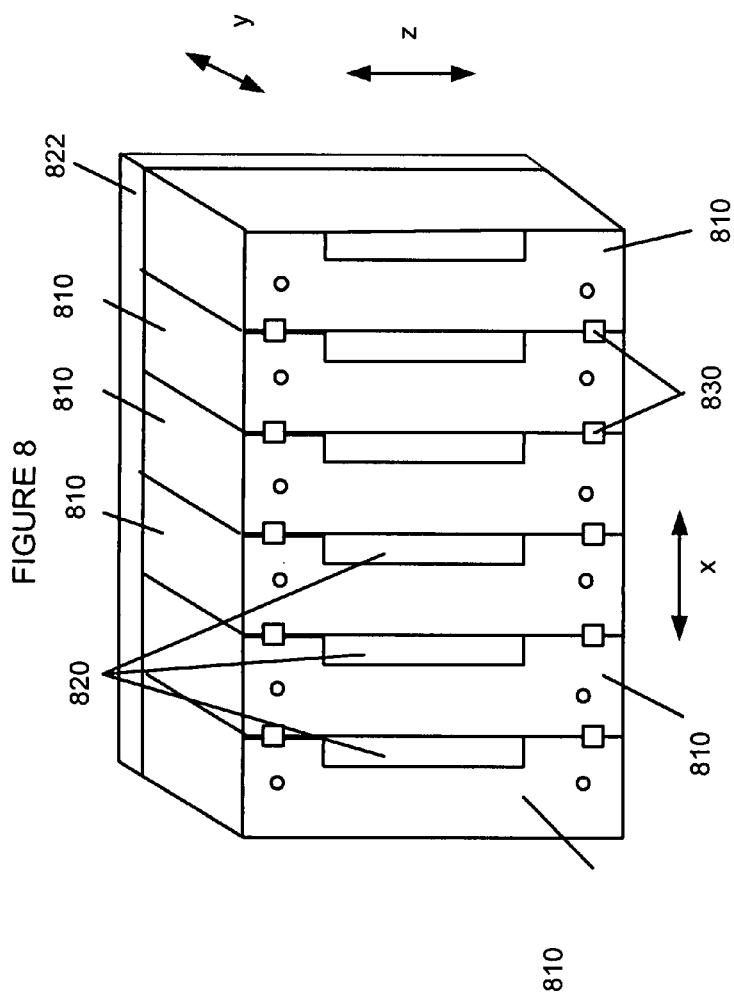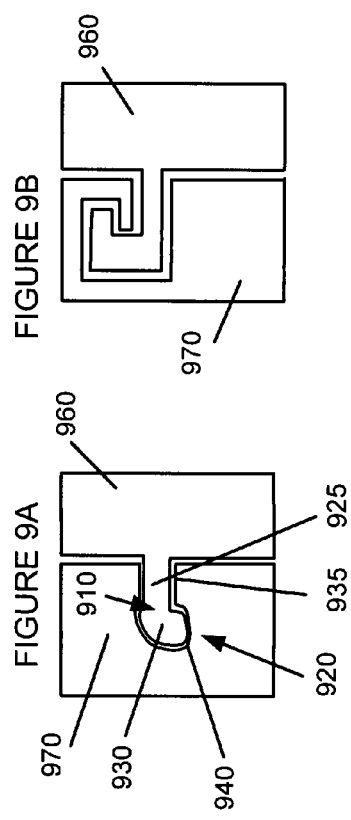

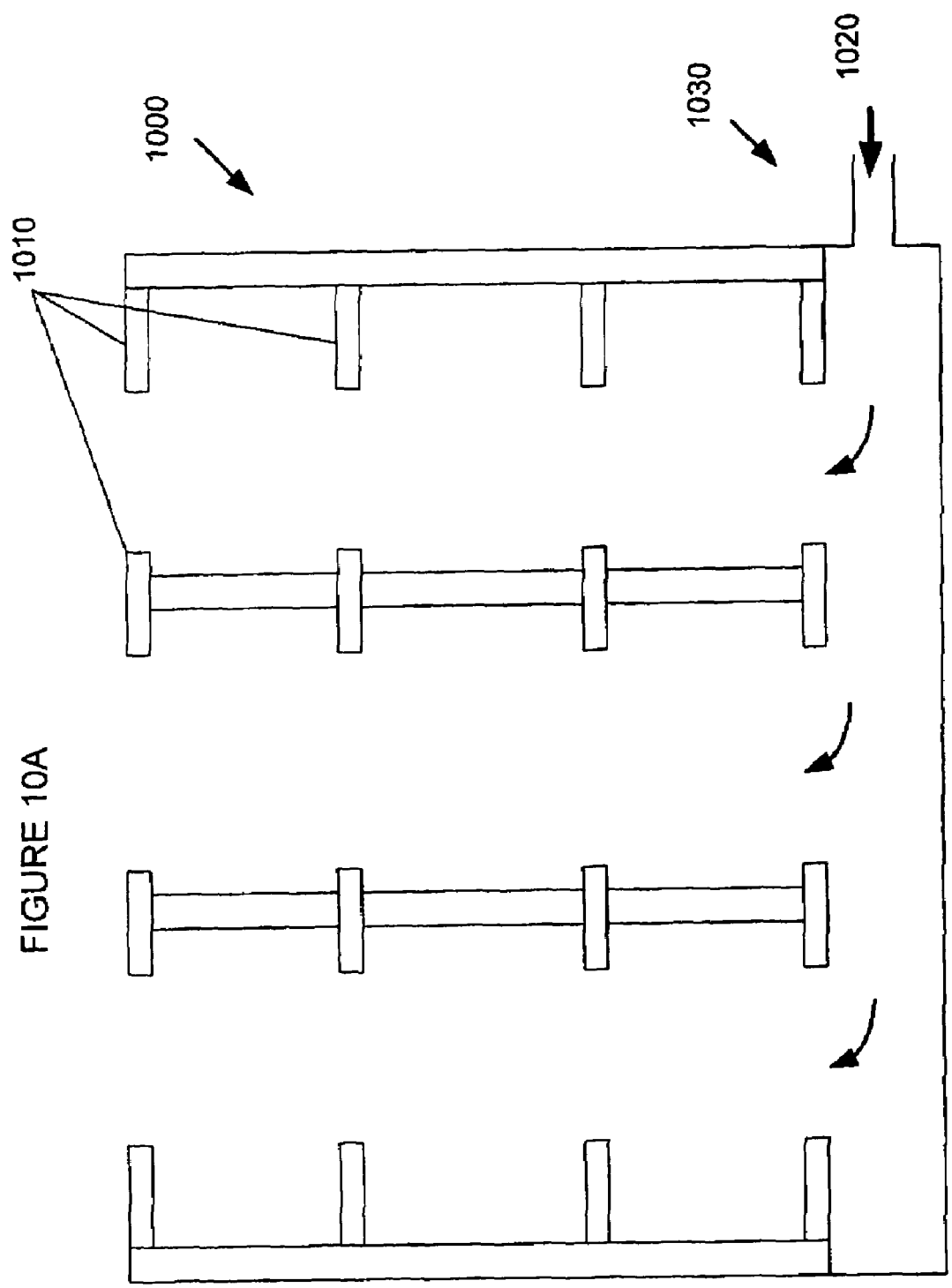

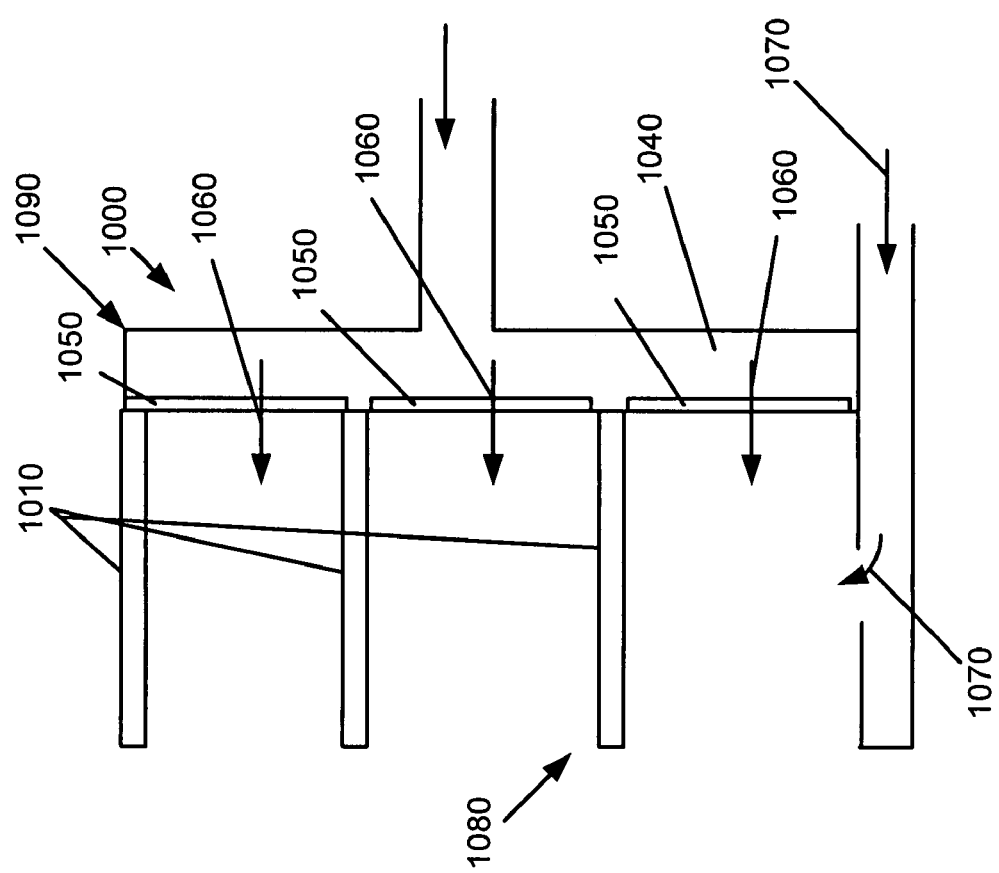

METHOD FOR ELECTRONICS EQUIPMENT COOLING HAVING IMPROVED EMI CONTROL AND REDUCED WEIGHT

CROSS-REFERENCE TO RELATED APPLICATIONS

This application relates to U.S. Patent Application Publication 2007/0086161, entitled Cross-Flow Redundant Air Cooling Method for High Reliability Electronics, to David Hartung, filed on the same day as this application, the contents of which are incorporated herein by reference in their entirety

BACKGROUND OF THE INVENTION

A. Field of the Invention

The invention relates generally to an apparatus for cooling avionics equipment, and in particular, to an apparatus for cooling avionics equipment by the flow of air across avionics modules housed in an avionics cabinet.

B. Description of the Related Art

Aircraft require electronics in order to control the various equipment needed to allow an aircraft to fly. Many of these electronics are housed in separate modules, whereby a plurality of modules are then fitted into one or more cabinets. The 'modularity' aspect of the modules allows for one defective module to be replaced independent of the other modules in the same cabinet.

Avionics modules, like other electronics modules, need to be cooled in order to prevent components within those modules from being overheated. Typically, avionics modules are cooled by the flow of cool air across the modules, in a convection type cooling system. In particular, an avionics electronics equipment cabinet and module requires ducting for forcing air over or nearby high power electronic components, in order to remove thermal energy from those components.

For conventional avionics electronics equipment cabinets, the need to include space for air ducts increases the size of those cabinets, thereby increasing the room required to house such cabinets.

It is desirable to reduce the size of air-cooled avionics electronics equipment cabinets, while maintaining the same or achieving better thermal energy removal characteristics for modules housed within the cabinets.

SUMMARY OF THE INVENTION

According to a first aspect of the invention, there is provided an air cooling apparatus for an aircraft, which includes a cabinet that is configured to house a plurality of modules in a plurality of module accepting regions, respectively, the cabinet having a backplane region. The apparatus also includes a plurality of air flow passages provided between adjacent ones of the respective module accepting regions of the cabinet. The apparatus further includes a primary air flow unit for providing primary air flow from the backplane region and through the plurality of air flow passages, to thereby cool the plurality of modules housed within the cabinet.

According to another aspect of the invention, there is provided an avionics module, which includes a rear surface having at least one connection region for connecting to a backplane on an avionics cabinet. The avionics module also includes a plurality of side surfaces, a lower surface having a plurality of openings for receiving an in-let air up draft, and an upper surface having a plurality of openings for receiving the in-let air up draft after having passed through an internal region of the avionics module.

According to yet another aspect of the invention, there is provided an avionics module, which includes a rear surface having at least one connection region for connecting to a backplane on an avionics cabinet, and a plurality of side surfaces. One of the side surfaces includes a recessed region that corresponds to a channel. The avionics module is configured to be abutted against adjacent avionics modules in the avionics cabinet. Air flow from the rear surface of the avionics module passes through the channel of the avionics module and the channel on a side surface of an adjacently-positioned avionics module, to thereby cool the avionics module.

BRIEF DESCRIPTION OF THE DRAWINGS

The foregoing advantages and features of the invention will become apparent upon reference to the following detailed description and the accompanying drawings, of which:

FIG. 4 is a diagram showing the coupling of a module into a cabinet, according to a fourth embodiment of the invention;

FIG. 5 shows a rear view of the module of the fourth embodiment;

FIG. 8 is a diagram showing the disposition of modules according to a sixth embodiment of the invention;

FIGS. 9A and 9B are diagrams respectively showing two different types of connection parts that can be used for the modules of FIG. 8; and FIGS. 10A and 10B are diagrams respectively showing a front view and a side view of a cabinet according to the first embodiment of the invention.

DETAILED DESCRIPTION OF SPECIFIC EMBODIMENTS

Figure 1:
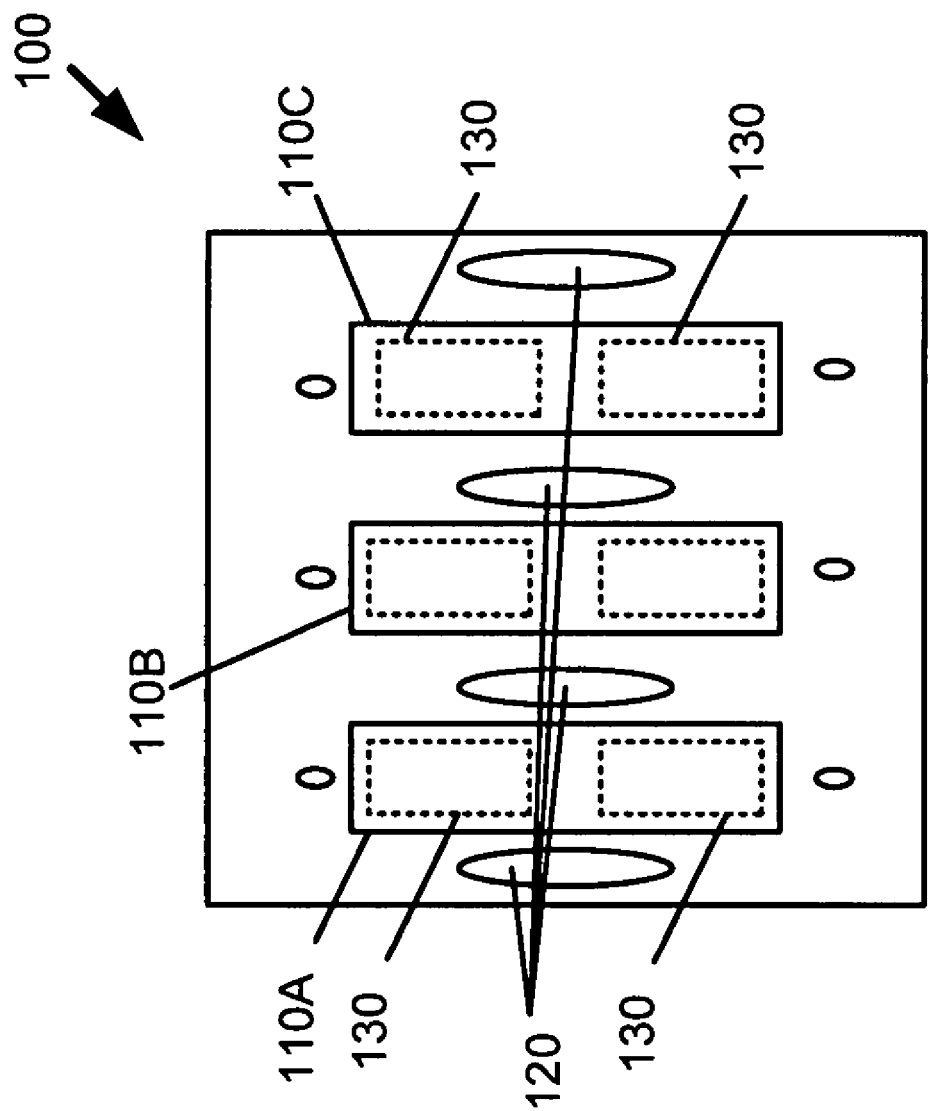
FIG. 1 is a diagram of a module receiving surface within an electronics cabinet, according to a first embodiment of the invention.

The present invention will be described in detail below, with reference to the accompanying drawings. The present invention relates to an air cooling apparatus for avionics cabinets, which reduces cabinet volume, lowers weight, and increases reliability as compared to conventional air cooled avionics cabinets. In at least one embodiment of the invention, an air flow is provided external to an electronics assembly, thereby reducing and practically eliminating the possibility of moisture and particulate in the air stream from depositing onto electronics, which may otherwise result in equipment failure.

A first embodiment of the present invention will be described below, with reference to the drawings. Because electronics interconnects within backplane (or control plane) architectures are moving towards fewer signals having faster speeds, it is becoming feasible to manufacture the backplane with appropriately spaced and sized holes between routing regions. These holes can then be protected by mounting/ chassis components to encapsulate the control plane within a metal structure. The structure, at the rear surface, provides a duct inlet connection with an aircraft supplied cooling air (preferably under pressure). The structure, at the front end, provides a hard mounting, electromagnetic interference (EMI) bond and connector Input/Output (I/O) region, which is segregated by mechanical features from the air passages. These air passages are then positioned to provide air flow between module surfaces when those modules are installed in a cabinet.

Mission critical systems may require supplemental cooling capability, in which a backup cool air flow source is used to provide cooling of modules in the case of a loss of the primary cool air flow. This typically requires complex electromagnetic design, valves, fan/blowers, and results in pressure drop control issues within the primary cooling system. In one embodiment of the invention, since a front panel I/O is used for all signal interfaces of modules to the aircraft, and due to a high speed serial I/O in the control plane (backplane), a relatively low number of signal routing interconnect is implemented in an XCP (10 gigabit) printed wiring board. Due to this, air ports are implemented through the backplane to provide direct air flow across module surfaces (either external or internal). Also, a supplemental air flow can be provided, whereby the supplemental air flow is isolated from the primary air flow, so as to eliminate the pressure drop variation issues or complex valve control issues that plague conventional systems. Exemplary embodiments of such airflows may be seen in U.S. patent application Ser. No. 11/249,263, entitled Cross-Flow Redundant Air Cooling Method for High Reliability Elecronics (referenced above) to David Hartung, filed on the same day as this application, the contents of which are incorporated herein by reference in their entirety. That is, the present invention may be utilized with some or all of the embodiments of the invention disclosed therein.

FIG. 1 shows a portion of an avionics cabinet, in accordance with a first embodiment of the invention. In the first embodiment, three modules 110A, 110B, 110C are housed in an avionics cabinet 100, whereby air flow passages 120 are provided between the modules 110A, 110B, 110C, so as to cool the side surfaces of the modules when cool air passes through those air flow passages 120. The view from FIG. 1 is with respect to the rear surfaces of the modules 110A, 110B, 110C, whereby the rear surfaces of the modules connect to a backplane (not shown) on the cabinet. The connection region for each module is surrounded by an EMI ground shield 130, which may correspond, for example, to finger stock. Cooling air is provided to the rear surface of each of the modules 110A, 110B, 110C, at a location whereby no backplane connect regions are located on the modules. In FIG. 1, this location corresponds to a middle region of each of the modules 110A, 110B, 110C. The cooling air is then directed through the air flow passages 120, in order to cool the side surfaces of the modules 110A, 110B, 110C.

Figure 2:
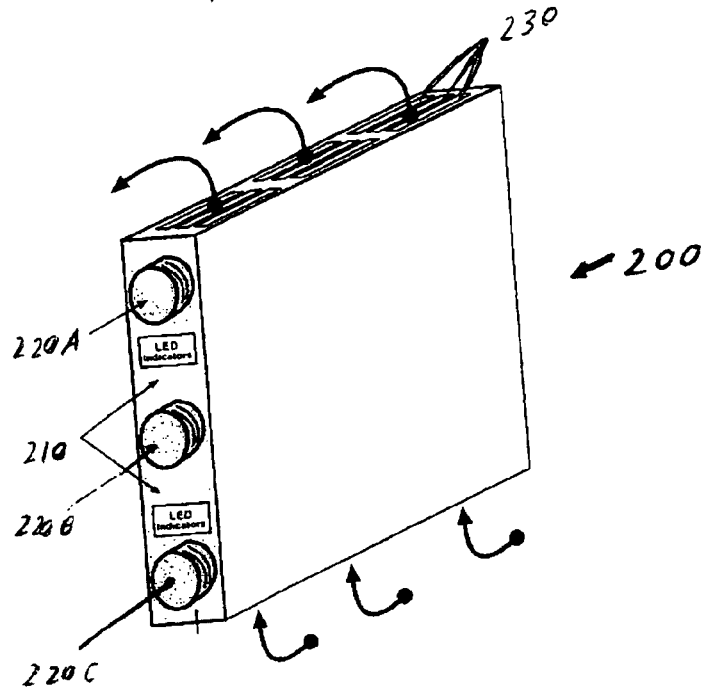
FIG. 2 is a diagram of a module according to a second embodiment of the invention.

FIG. 2 shows a module 200 that may be fitted onto an avionics cabinet according to a second embodiment of the invention. The module 200 includes a front surface 210, which is shown as having LED indicators 220A, 220B, 220C. The module has openings 230 at a top surface and at a bottom surface (not shown), for allowing inlet air up draft to pass through the module 200 from the bottom to the top of the module 200, and thereby directly cool electronic components housed within the module 200. The inlet air up draft may correspond to a secondary air flow that is provided in an avionics cabinet, whereby the primary air flow is provided by the structure as shown in FIG. 1, for example. In a preferred implementation of this embodiment, the openings 230 are covered by mesh filters, so that particulates and other matter are collected by the filters and do not pass into the module 200, whereby those particulates and other matter may otherwise cause problems with respect to electronic components within the module 200.

Figure 3:
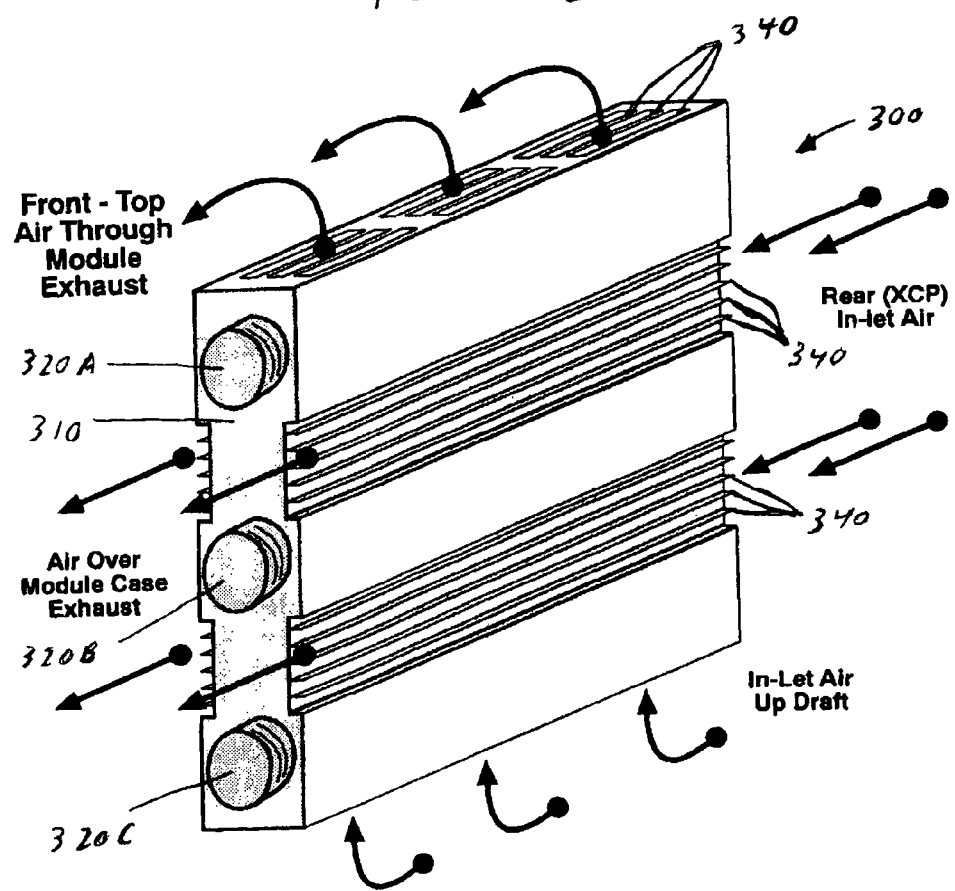
FIG. 3 is a diagram of a module according to a third embodiment of the invention.

FIG. 3 shows a module 300 that may be fitted onto an avionics cabinet according to a third embodiment of the invention. The module 300 includes a front surface 310, which is shown as having LED indicators 320A, 320B, 320C. The module 300 also includes a rear surface (not shown), which directly receives primary in-let air from the direction of the backplane. The primary in-let air passes across the side surfaces of the module 300, whereby the side surfaces include fins 340 that direct the air onto particular locations on the sides of the module 300. That way, the primary air flow can be directed onto particular portions of the module 300 which generate more heat than other portions of the module 300. Also shown in FIG. 3 is an in-let air up draft that flows through an interior of the module 300, from openings in the bottom (not shown) of the module to openings 340 in the top of the module 300, whereby the in-let air up draft corresponds to an independent secondary air flow.

In the second and third embodiments, the aircraft system provides a primary cooling airflow, which typically is a pressurized air flow. That pressurized primary air flow is provided through the backplane, and makes initial contact with the rear surfaces of modules housed within cabinets. A secondary air flow, which provides the secondary air cooling, is provided to the modules housed within the cabinet by an internal fan or by some other pressurized air system, in order to provide dual cooling systems for the modules.

FIG. 4 shows a module 410 housed within an avionics cabinet in accordance with a fourth embodiment of the invention. The module may have a structure as shown in FIG. 2 or 3, for example. In FIG. 4, plenum inlet air is provided to a rear surface of a cabinet 420 by ducting, for example. When the module 410 is placed within an opening in the cabinet 420, a baffle with spring closure mechanism 430 is actuated by the top and bottom engagement pins 412A, 412B of the module 410 making contact with the baffle and spring closure mechanism 430, thereby opening up a primary air flow path in that particular opening in the cabinet 420.

With the module rear face plate in contact with the backplane, and with the baffle in an open position, plenum inlet air flows into the region in the cabinet 420 where the module 410 is located. Referring now to FIG. 5, which shows a rear surface 510 of the module 410, the primary air flow makes contact with a center region 520 on the rear surface 510 of the module 410, whereby the center region 520 does not include any connector regions 530. The connector regions 530 are provided on a top region 522 and a bottom region 524 on the rear surface 510 of the module 410. Each connector region 530 is surrounded by an EMI shield, such as finger stock (see FIG. 1). Accordingly, there are two segregated routing regions for the module 410, whereby neither routing region directly receives the primary inlet air flow. The center region 520 is preferably recessed with respect to other portions of the rear surface 510 of the module 410, to provide for air ducting across the side surfaces of the module 410.

The arrows in FIG. 5 show the different paths portions of the inlet air flow take after making initial contact with the rear surface 510 of the module 410. In more detail, the primary air flow makes initial contact with the center region 520 on the rear surface of the module 410, and then spreads across the side surfaces of the module 410, towards a front portion of the module 410. As shown in FIG. 3, fins may be provided on the side surfaces of the module 410, in order to direct air across the module. Also, air passages may be provided in the cabinet, such as shown in FIG. 1, in order to direct the primary air flow from a rear surface, across the side surfaces, and finally out of the cabinet.

By having a baffle with spring closure mechanism for each cabinet module opening that is actuated by top and bottom engagement pins of a module, only the cabinet openings that are currently housing modules receive primary air flow, whereby cabinet openings that do not currently house a module have their respective baffles in a normally closed position, to thereby block inlet air flow through those cabinet openings. This allows for stronger air flow in the regions of the cabinet that are currently housing modules, which is a desirable feature.

Figure 6:
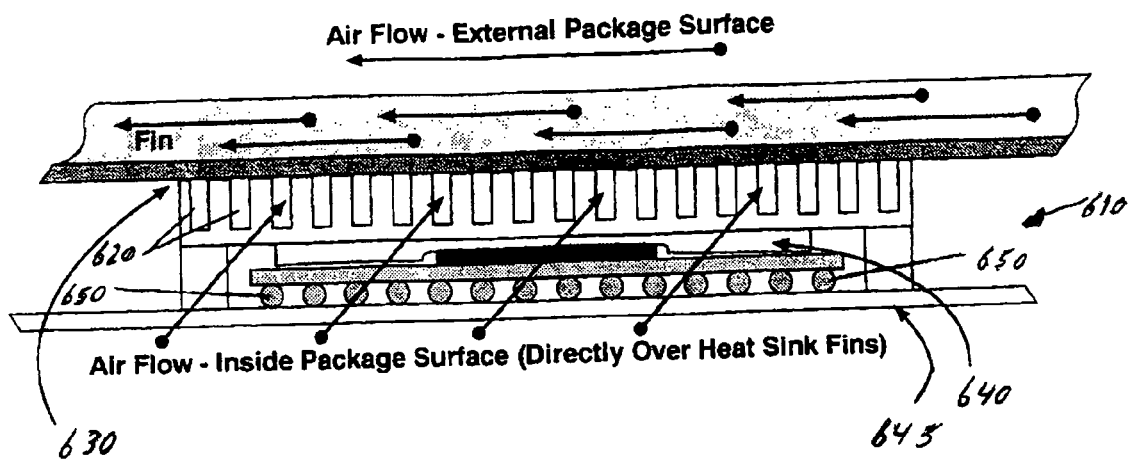
FIG. 6 is a cross sectional view of internal components of a module according to an embodiment of the invention.

FIG. 6 shows a cross sectional view of a module 610 having fins on its outer surface, whereby an air flow across the fins provides for cooling of heat sink fins 620 provided on an internal heat sink 630 of the module 610. A printed wiring board 645 is connected to the internal heat sink 630, whereby the heat sink fins 620 receive heat generated by the printed wiring board 645, and whereby the air flow across the external fins on the other surface of the module 610 help cool the heat sink fins 620 and thereby help cool the printed wiring board 645. Also shown in FIG. 6 is a thermal transfer pad 640 that is coupled to heat sink fins 620. A ball grid array 650, which is a high point heat source, is also shown in FIG. 6.

Figure 7:
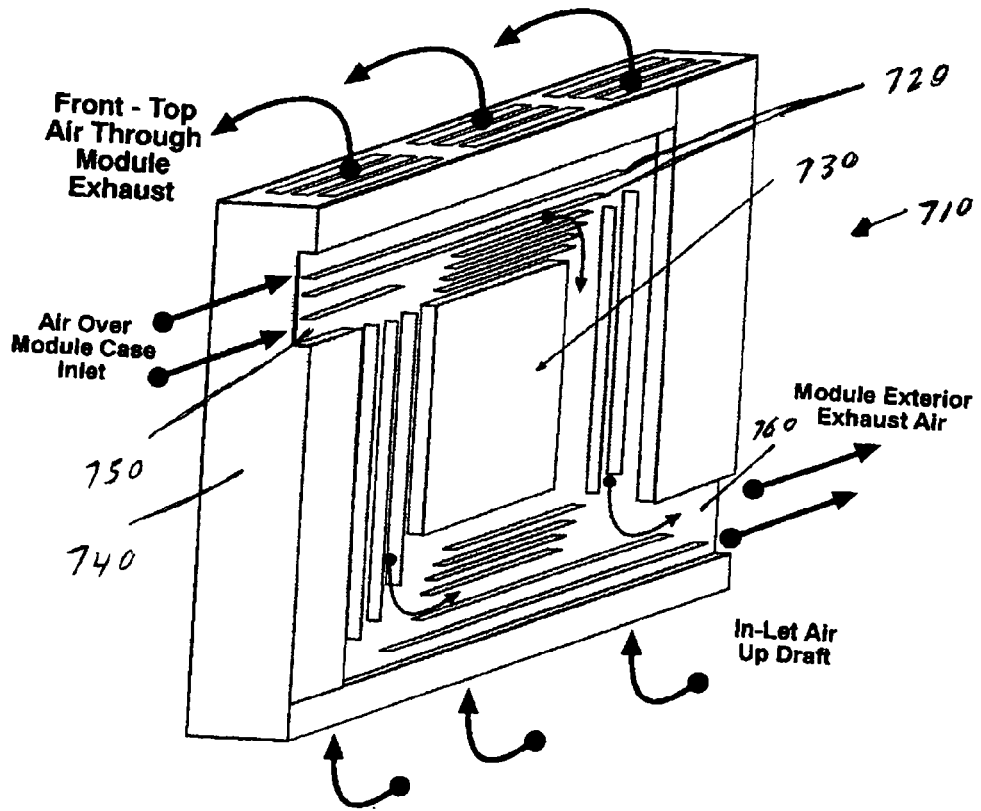
FIG. 7 is a diagram of a module according to a fifth embodiment of the invention.

FIG. 7 shows a module 710 according to a fifth embodiment of the invention, whereby fins 720 provided on a side surface of the module 710 are configured in order to direct air flow across a particular portion of the module 710. In FIG. 7, the air flow is directed across a center part 730 of the module 710, where thermal transfer is particularly required. The air flow is directed from a rear surface 740 of the module 710 to an air inlet 750, whereby a first portion of the air flow passes across a top of the center part 730, then downward (to cool a right side of the center part 730), and then across to an air outlet 760. A second portion of the air flow from the rear surface 740 of the module 710 passes from the air inlet 750 downward (to cool a left side of the center part 730) and then across a bottom portion of the center part 730, and then straight out to the air outlet 760. Also, a separate secondary air flow may be utilized, as explained previously, to provide an in-let air up draft to pass internally through the module 710.

FIG. 8 shows a cooling system according to a sixth embodiment of the invention, whereby adjacent modules 810 are connected to each other on a same row of a cabinet. Each module 810 is shown as having a substantially rectangular shape, with a notch or channel 820 provided on their right side surface, and with a connection part 830 provided on a right side and on a left side surface of the module 810. Each module 810 is connected to a rigid backplane assembly 822.

The connection part 830 of the modules 810 may be configured in any of a variety of ways, such as the ones shown in FIGS. 9A and 9B, by way of example and not by way of limitation. In FIG. 9A, a module is configured with a male connection part 910 on one (e.g., left) side of the front surface of the module 810 and a female connection part 920 on an opposite (e.g., right) side of the front surface of the module 810, whereby adjacent modules provided on a same row of a cabinet are situated in a male/female/male/female . . . configuration or a female/male/female/male . . . configuration. In FIG. 9A, the male connection part 910 corresponds to a neck portion 925 and a head portion 930, while the female connection part 920 corresponds to a neck-receiving region 935 and a head-receiving region 940. As shown in FIG. 9, this provides for an X-axis interlock among the modules 810.

In FIG. 9B, the male connection part 960 has an L-shape, while the female connection part 970 is sized to accept the L-shaped male connection part 960. The connection parts shown in FIGS. 9A and 9B correspond to finger lock tabs that allow the modules 810 to be interlocked to adjacent modules in an avionics cabinet. The finger lock tabs can be extruded onto the modules 810 during manufacturing of the modules 810. The notch or channel 820 for each module 810 allows for the primary air flow from the backplane region of the cabinet, across the side surfaces of the modules 810, and out to the front of the cabinet. In an alternative implementation, fins may be provided in one or both side surfaces of the modules 810, to enhance the air flow across the modules 810.

Additionally, rows of modules may be provided directly on top of the row of modules shown in FIG. 8, and directly below the row of modules shown in FIG. 8, in order to eliminate the need for upper and lower cabinet surfaces all together.

FIGS. 10A and 10B respectively show different views of a cabinet 1000 that can be utilized in the first embodiment of the invention, in order to provide a primary cooling air flow from the backplane portion at the rear of the cabinet, and that can provide a secondary cooling air flow from a location beneath the lowest row of modules on the cabinet 1000. FIG. 10A shows a front view of the cabinet 1000, whereby the cabinet 1000 has a plurality of rails 1010 on which modules can be slid onto, to thereby fit the modules within the cabinet 1000. A secondary air flow path 1020 provides air from a bottom portion 1030 of the cabinet 1000, whereby that secondary air flow provides for air to pass up from the lowest row of modules up to the highest row of modules, and then out of the cabinet 1000. The arrows provided at the bottom of FIG. 10A show the direction of the secondary air flow into the cabinet 1000. The module 200 of FIG. 2, which allows for air to pass from a bottom surface to a top surface of the module 200 via openings 230, may be utilized to fill the cabinet 1000, to thereby provide for a secondary cooling effect.

FIG. 10B shows a side view of the cabinet 1000, whereby the module-holding rails 1010 can be seen from a different angle than what was shown in FIG. 10A. Also, FIG. 10B shows the primary air flow path 1060 that enters into the cabinet 1000 from a back portion 1040 of the cabinet 1000, and whereby the arrows shown in the top and middle portion of FIG. 10B show the direction of the primary air flow 1060 into the cabinet 1000. Also shown at the bottom of FIG. 10B is a side view of the secondary air flow path 1070, with the arrows provided at the bottom portion of FIG. 10B showing the direction of the secondary air flow 1070 into the cabinet 1000. Also shown in FIG. 10B are baffles 1050 that either allow primary air flow 1060 into respective module locations, or prevent the primary air flow 1060 into the respective module locations. In particular, module locations that are currently housing a module receive primary air flow 1060 due to the opening of their respective baffles 1050 by way of the respective modules (e.g., by the module's guide pins), and module locations that are currently empty do not receive any primary air flow 1060 due to their respective baffles being in their normally closed position. The front part of the cabinet 1000 is shown by arrow 1080, and the back part of the cabinet 1000 is shown by arrow 1090.

One benefit of the present invention as compared to conventional avionics cooling systems is that a reduced cabinet space is achieved, since no plenum is needed above or below the modules in the cabinet. Also, air flow into the modules, in accordance with one embodiment of the invention, keeps the electronic components within the modules free from moisture condensate and particulates that can impead heat transfer and cause reliability failure issues. Furthermore, the use of a normally closed baffle/shutter in a rear connection region of the cabinet provides a relatively simple way to close air flow when a module is removed from a cabinet, while not causing loss of cooling for adjacent modules in the same cabinet. Additionally, as explained with respect to the fourth embodiment, an air flow can be designed for a particular module to optimize the cooling effect for particular portions of that module. An exemplary embodiment of the present invention allows for the provision of an aircraft signal interface directly on a modular electronics assembly (e.g., avionics module) originating/receiving a signal without the use of/passing through, a backplane which is typically employed in modular avionics electronics assemblies (see, e.g., FIG. 2, connectors 220A-C). In an exemplary embodiment, there is an air vehicle, comprising an airframe and a plurality of avionics modules that at least one of originates and receives an electrical signal, wherein the avionics modules include at least one aircraft signal interface directly on the avionics module, wherein an aircraft signal does not pass through a backplane assembly.

Thus, different embodiments of an avionics cabinet cooling apparatus have been described according to the present invention. Many modifications and variations may be made to the techniques and structures described and illustrated herein without departing from the spirit and scope of the invention. Accordingly, it should be understood that the methods and apparatus described herein are illustrative only and are not limiting upon the scope of the invention.

What is claimed is:

1. An air cooling apparatus for an aircraft, comprising:
   a cabinet that is configured to house a plurality of modules in a plurality of module accepting regions, respectively, the cabinet having a backplane region;
   a plurality of air flow passages provided between adjacent ones of the respective module accepting regions of the cabinet; and
   a primary air flow unit for providing primary air flow from the backplane region and through the plurality of air flow passages along a direction from a back portion of the cabinet to a front portion of the cabinet, to thereby cool the plurality of modules housed within the; and
   a secondary air flow unit for providing secondary air flow from a bottom portion of the cabinet and upwards into the cabinet, to thereby cool the plurality of modules within the cabinet.

2. The air cooling apparatus according to claim 1, wherein the secondary air flow unit is separate from and independent of the primary air flow unit.

3. The air cooling apparatus according to claim 1, further comprising:
   an air duct for providing the primary air flow to rear surfaces of the plurality of modules housed in the cabinet.

4. The air cooling apparatus according to claim 1, further comprising:
   means for allowing the primary air flow to flow along the direction from the back portion of the cabinet to the front portion of the cabinet.

5. The air cooling apparatus according to claim 1, wherein the front portion of the cabinet corresponds to an area from which the plurality of modules are inserted into the cabinet.

6. The air cooling apparatus according to claim 4, wherein the allowing means comprises:
   a baffle; and
   a spring closure mechanism,
   wherein the spring closure mechanism is configured to engage with pins provided on a back surface of a module, to thereby open the baffle from a normally-closed position when the module is inserted into a respective module accepting region in which the baffle and spring closure mechanism are located.

7. An air cooling apparatus for an aircraft, comprising:
   a cabinet that is configured to house a plurality of modules in a plurality of module accepting regions, respectively, the cabinet having a backplane region, the cabinet including a plurality of rails that are provided so as to form a respective plurality of rows for holding the plurality of modules in place within the cabinet;
   a plurality of air flow passages provided between adjacent ones of the respective module accepting regions within each of the plurality of rows of the cabinet; and
   a primary air flow unit for providing primary air flow from the backplane region and through the plurality of air flow passages, to thereby cool the plurality of modules housed within the cabinet; and
   means for allowing the primary air flow to flow along the direction from a back portion of the cabinet to a front portion of the cabinet,
   wherein the allowing means comprises:
   a baffle; and
   a spring closure mechanism,
   wherein the spring closure mechanism is configured to engage with pins provided on a back surface of a module, to thereby open the baffle from a normally-closed position when the module is inserted into a respective module accepting region in which the baffle and spring closure mechanism are located.

8. The air cooling apparatus according to claim 7, wherein the primary air flow through any one of the plurality of rows does not pass through any other of the plurality of rows.

* * * * *